United States Patent

Lo Curto et al.

[11] Patent Number: 6,161,003
[45] Date of Patent: Dec. 12, 2000

[54] AUTOMATIC LOCAL OSCILLATOR FREQUENCY STABILIZATION PROCESS IN RADIO RECEIVERS EMPLOYING A WIDE-BAND TUNABLE LOCAL DIELECTRIC-RESONATOR OSCILLATOR AND ASSOCIATED DEVICE

[75] Inventors: Michelangelo Lo Curto, Desio; Giuseppe De Marzi, Sondrio; Giuseppe Dimonte, Biassono, all of Italy

[73] Assignee: Italtel SpA, Milan, Italy

[21] Appl. No.: 08/981,553

[22] PCT Filed: Jun. 27, 1996

[86] PCT No.: PCT/EP96/02823

§ 371 Date: Jun. 11, 1998

§ 102(e) Date: Jun. 11, 1998

[87] PCT Pub. No.: WO97/02657

PCT Pub. Date: Jan. 23, 1997

[30] Foreign Application Priority Data

Jun. 30, 1995 [IT] Italy .................................. MI95A1397

[51] Int. Cl.[7] ...................................................... H04B 1/06
[52] U.S. Cl. ............................ 455/260; 331/176; 331/10; 455/260
[58] Field of Search ..................................... 455/255, 256, 455/257, 258, 259, 260, 263, 264, 75, 77; 331/2, 17, 34, 10, 176

[56] References Cited

U.S. PATENT DOCUMENTS

| 4,712,078 | 12/1987 | Slobodnik, Jr. et al. |
| 5,311,318 | 5/1994 | Dobrovolny. |
| 5,487,186 | 1/1996 | Scarpa ................................... 455/192.2 |
| 5,499,393 | 3/1996 | Fukui ...................................... 455/264 |
| 5,542,114 | 7/1996 | Kojima et al. ....................... 455/196.1 |
| 5,740,525 | 4/1998 | Spears .................................... 455/259 |
| 5,848,355 | 12/1998 | Rasor ..................................... 455/260 |
| 5,893,029 | 4/1999 | Bastani .................................. 455/324 |

FOREIGN PATENT DOCUMENTS

0475262A1  3/1992  European Pat. Off. .

*Primary Examiner*—Reinhard J. Eisenzopf
*Assistant Examiner*—N. Mehrpour

[57] ABSTRACT

There is described a stabilization process for the local oscillator frequency in wide-band tunable DROs employed in receivers of a digital microwave radio link. A microprocessor, already provided for normal operation control, cyclically reads the control voltage of a VCO inserted in PLL which reconstructs an intermediate frequency carrier used to coherently demodulate the received signal. The voltage read is compared with an optimal reference value by taking an error signal which controls a varicap diode of the DRO for tuning correction. With each reading, the optimal value can be modified on the basis of temperature data supplied by a heat sensor to cancel the effect of temperature on the reference.

15 Claims, 4 Drawing Sheets

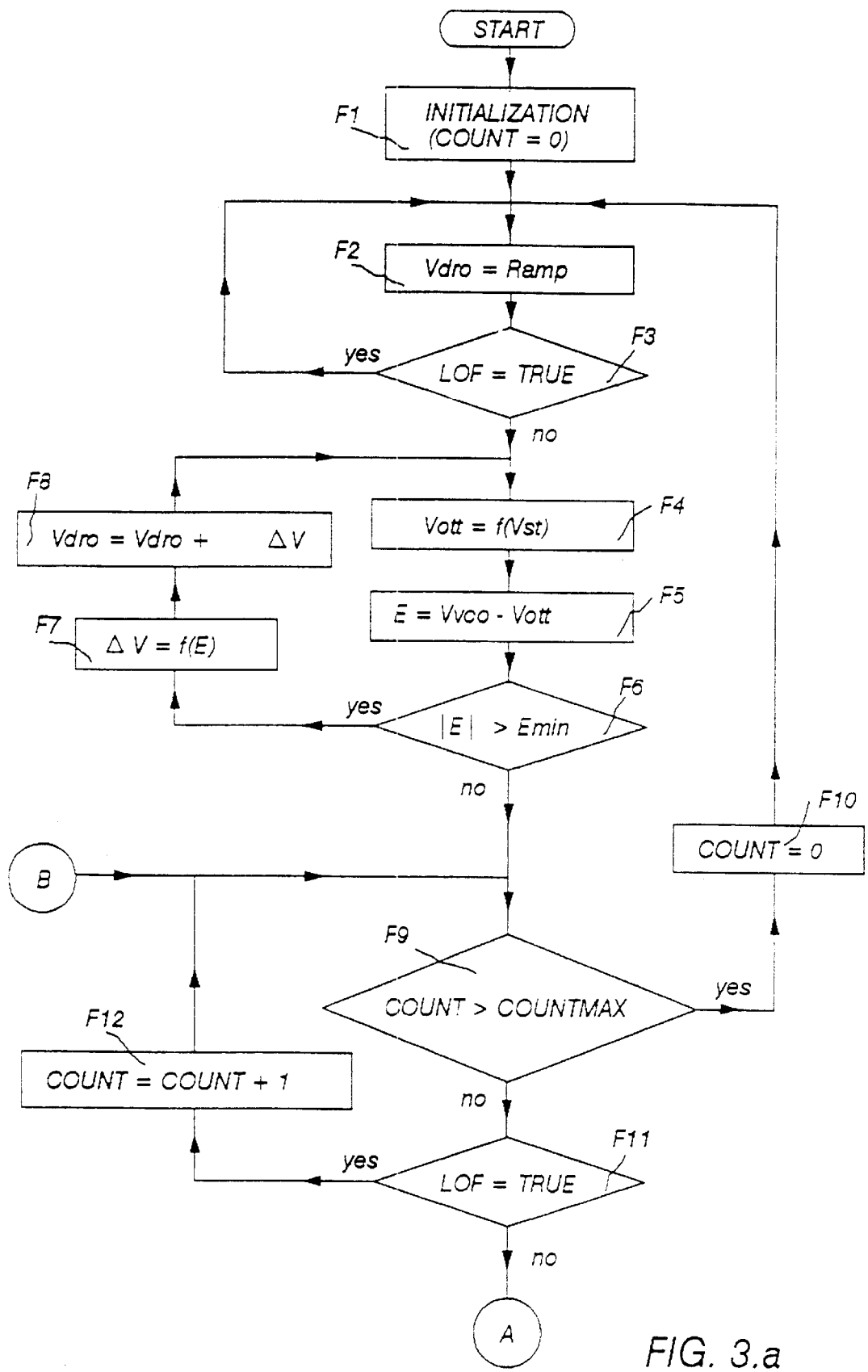
FIG. 3.a

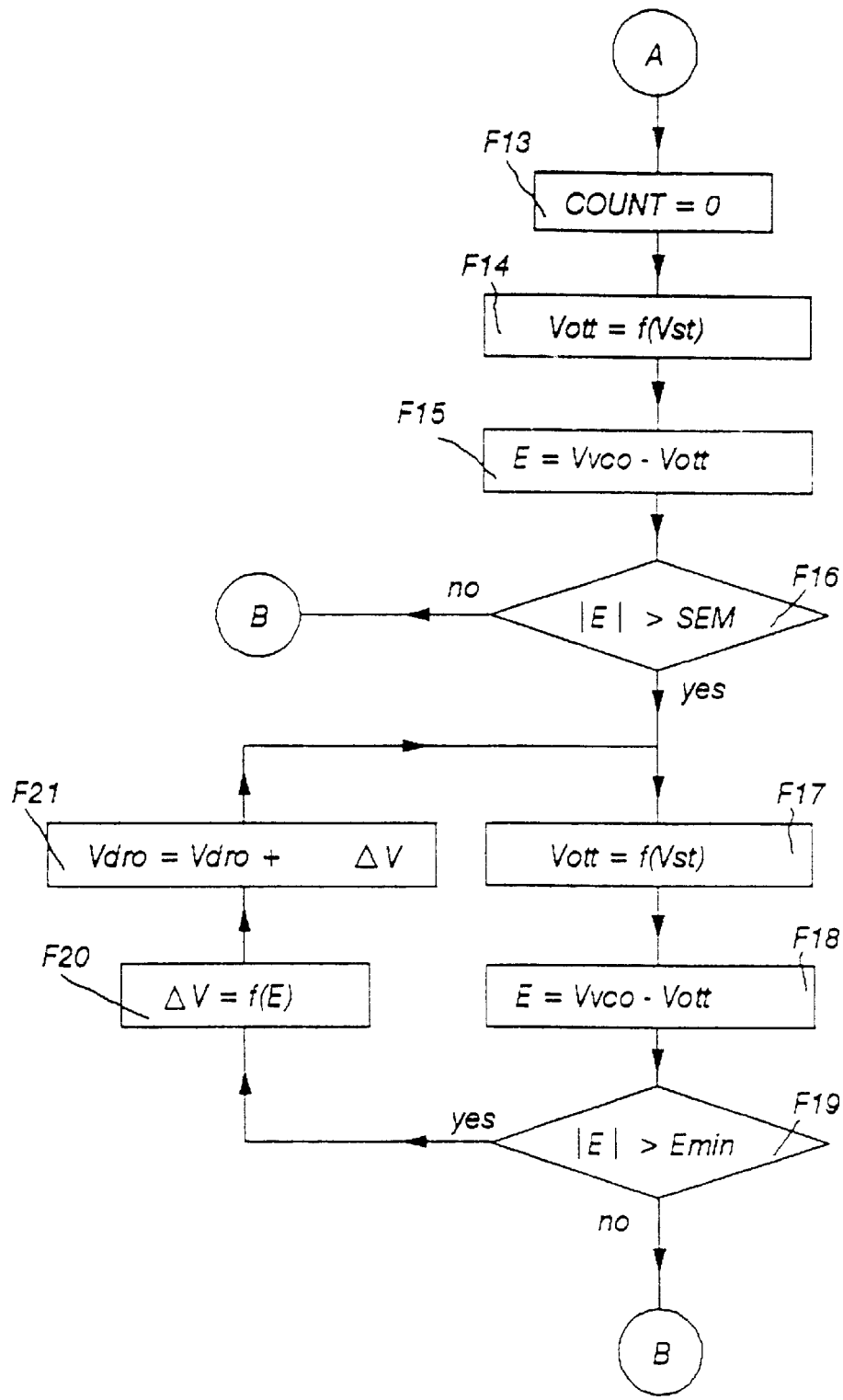
FIG. 3.b

AUTOMATIC LOCAL OSCILLATOR FREQUENCY STABILIZATION PROCESS IN RADIO RECEIVERS EMPLOYING A WIDE-BAND TUNABLE LOCAL DIELECTRIC-RESONATOR OSCILLATOR AND ASSOCIATED DEVICE

This application is the national phase under 35 U.S.C. §371 of prior PCT International Application No. PCT/EP 96/02823 which has an International filing date of Jun. 27, 1996 which designated the United States of America, the entire contents of which are hereby incorporated by reference.

DESCRIPTION

The present invention relates to the field of radio signal transmission characterized by coherent demodulation, and specifically to a process and device for automatic local oscillator frequency stabilization in radio receivers employing a wide-band tunable local dielectric-resonator oscillator.

Coherent demodulation is used in a large part of both public and private professional transmission systems, among which an important place is reserved certainly for microwave radio links and satellite communications systems.

FIG. 1 shows a typical block diagram for a transmitter and a receiver connected to the same antenna and which find use in the above mentioned professional systems. The diagramming is quite general and can represent any system, whether analog or digital, characterized by coherent demodulation.

With reference to FIG. 1 there is seen a block 1 at whose input arrives a base band signal $S_T$ to be transmitted. The signal $S_T$ is in most cases a complex signal obtained by appropriately multiplexing multiple elementary signals coming e.g. from multiple telephone channels. To maintain greater generality in the discussion, in FIG. 1 a multiplexing block for these channels is not shown. The block 1 comprises circuits which perform on the signal $S_T$ known operations such as, for example, filtering and which are preliminary to the modulation operations of a carrier, frequency conversion and subsequent transmission. The signal from block 1 reaches a first input of a modulator 2 which uses the input signal as a modulating signal for an intermediate frequency oscillation $f_i$ present at a second input of this block. The modulated signal from block 2 reaches in turn an input of a frequency converter 3 (up-converter) to which arrives also a frequency oscillation $f_{olt}$ generated by a local transmission oscillator 4. The block 3 converts this modulated signal into a radiofrequency transmission signal. The signal from block 3 is amplified by a linear radiofrequency power amplifier, represented by block 5, and then coupled to a first gate of a directional coupler represented by block 6. A second gate of the directional coupler 6 is coupled to an antenna 7 while a third gate thereof is coupled to a radiofrequency receiving amplifier 8 characterized by low noise-figure value. On the paths from block 5 to block 6 and therefrom to block 8 are respectively inserted a band-pass transmission filter and a band-pass receiving filter, not shown in the figure, generally with different center-band frequencies.

The directional coupler 6 and the respective filters (duplexers) allow radiation by the antenna 7 of the transmission signal without disturbing the reception path and simultaneous correct routing of a receiving signal received by the antenna 7 toward the amplifier 8. The signal from the amplifier 8 reaches an input of a second frequency converter 9 (down-converter) to which also arrives a frequency oscillation $f_{olr}$ generated by a local receiving oscillator 10. The block 9 converts to intermediate frequency $f_i$ the radiofrequency receiving signal present at its own input. The signal from block 9 reaches a demodulator 11 which returns it to base band, utilizing for this purposes an intermediate frequency carrier reconstructed locally starting from the carrier data contained in the signal from the converter 9, after appropriate intermediate frequency filtering by a filter not shown in FIG. 1.

The base-band signal at the output of the demodulator 11 reaches a block 12 which performs on the signal known operations designed to restore a received signal $S_R$ which is a faithful copy of the signal $S_T$ originally transmitted. By analogy with the above remarks concerning the signal $S_T$, the signal $S_R$ must be demultiplexed into the individual component signals. Again in this case, to maintain greater generality in discussion, a demultiplexing block for these signals is not shown, while for the sake of simplicity a processing block which keeps the operation of the various blocks of FIG. 1 under control is not shown, although present.

As known, the operation performance of professional transmission systems including the equipment of FIG. 1 is generally subject to very severe specifications, observation of which implies often costly and cumbersome circuitry solutions. For example, for the transmission amplifier 5 good linearity even at the highest amplification values is required, for the receiving amplifier 8 low input stage noise is required, and for the local oscillators 4 and 10 high spectral purity and optimal long-term stability of the generated frequency are required. In addition, a highly appreciated feature in receivers is the ability to change on a wide band the local oscillator frequency, to be able to select the desired frequency range.

In the older transmission systems all the blocks of FIG. 1 were provided in analog technology and the transmission carrier was modulated with continuity of the analog signal $S_T$. In cases of multiplexing multiple telephone channels on a single transmission means, multiplexing took place with frequency division (FDM) and involved high production costs.

With the success of digital electronics it has become more convenient to appropriately digitize the starting analog signals, where possible, and apply numerical techniques (DSP) to the signals thus obtained. In cases of digital signal multiplexing, there is used the known time division technique (TDM) and in this case the modulating signal $S_T$ consists of a bit string. Modulation techniques have also evolved to become better suited to the peculiar characteristics of such a modulating signal. In particular there has been progress from continuous transmission carrier modulations to discrete modulations, among which are recalled PSK and QAM and their variants. These modulations, also known as digital modulations, are again included in the engineering field where the invention falls because they also assume coherent demodulation. Indeed, the demodulator 11 includes a voltage controlled oscillator (VCO) inserted in a phase-locked loop (PLL) for reconstruction of an intermediate-frequency carrier used for demodulation.

When adopting digital modulation, the base-band operations carried out by blocks 1 and 12 and the intermediate frequency operations carried out by the modulator blocks 2 and the demodulator 11 change radically, while the radiofrequency operations carried out by the blocks 3, 4, 5, 6, 7, 8, 9 and 10 remain unchanged.

Thanks to the high operating speed reached by digital circuits at the potentials offered by computer-aided design it is possible today to produce the base band, modulator and demodulator blocks by means of a single large scale integrated circuit to obtain a considerable reduction of size and greater economy and reliability of the equipment.

For obvious reasons it is not possible to extend the same advantages to the remaining blocks, which can only be analog, and thus considerably affect overall equipment cost. Accordingly, all those technical solutions which allow economies in the analog part, especially if operating in the microwave field, are attractive.

It is in this direction that the invention which is the subject of the present invention moves, in particular to the achievement of advantages in the realization of local microwave oscillators. As mentioned above, what is asked of a local oscillator is frequency stability, spectral purity, ample tuning interval, small size and low cost; these are characteristics difficult to achieve together.

An example of local microwave oscillators in accordance with the prior art consists of the use of a high-Q dielectric resonator DR for determination of the oscillation frequency. The advantages of this solution are good stability of the generated frequency, low phase noise, small size and low production cost. On the other hand these oscillators, called hereinafter DROs, exhibit generally rather narrow tuning intervals and it is thus necessary to replace the DRs when it is desired to change the tuning range.

A second embodiment consists of the use of a frequency synthesizer for generating the local oscillator frequency. With this it is possible to meet the requirements of stability and purity mentioned above and have an ample tuning interval at the same time. The great advantage of synthesizers is just that of covering different frequency ranges without difficulty; on the other hand they are rather complex and costly, especially in microwave operation.

They are known in the art of wide-band tunable DROs, also termed 'disbandable', in which tuning is changed by rotation of a screw provided for this purpose. It might be thought to use these latter DROs to obviate the shortcomings resulting from the limited tuning range of the DROs of the first example. This way it would be possible to change frequency range merely by changing the position of the tuning screw. Unfortunately these latter DROs generate an oscillation frequency whose long-term stability is decidedly low, this means that because of heat drift and aging the frequency generated shifts slowly from the initial value until it passes outside the established limits. This fact constitutes a serious shortcoming such as to prejudice the use of disbandable DROs in professional transmission systems. But it would be possible to obviate the shortcomings resulting from the poor long-term stability of the shiftable DROs by linking their frequency to the much more stable frequency generated by a reference quartz oscillator. In this case there would reappear the same shortcomings as those of the frequency synthesizers.

U.S. Pat. No. 4,712,078 relates to a digital compensation circuit for improving the temperature stability of dielectric resonator oscillators. The frequency drift in a dielectric resonator is compensated by a correlated phase shift, in response to a temperature sensor measuring the ambient temperature. This document exhibits structural details implementing temperature detection digitizing (A/D, D/A) and processing the measured temperature values and generating a control signal in dependence thereof, which are also used in the present application.

Accordingly the purpose of the present invention is to overcome the above mentioned shortcomings and provide an automatic frequency stabilization process for the local oscillator frequency in radio receivers employing a local oscillator with wide-band tunable dielectric resonator.

These objects are solved, by the present invention.

The features of the present invention which are believed to be novel are set forth with particularity in the appended claims.

It is easy to verify that the process which is the object of the present invention supplies to the receiver implementing it all the above mentioned advantages deriving from use of a disbandable DRO without inheriting its shortcomings. The above mentioned advantages are also achieved at virtually no cost because the microprocessor implementing the process is normally already present to control operation of the various circuits and equipment. Another but not negligible advantage is neutralization of any instability in the transmitter frequency.

Further purposes and advantages of the present invention are clarified in the detailed description of an embodiment thereof given below by way of nonlimiting example with reference to the annexed drawings wherein:

FIG. 1 is fully described in the introductive part with reference to the prior art.

Figure 1:
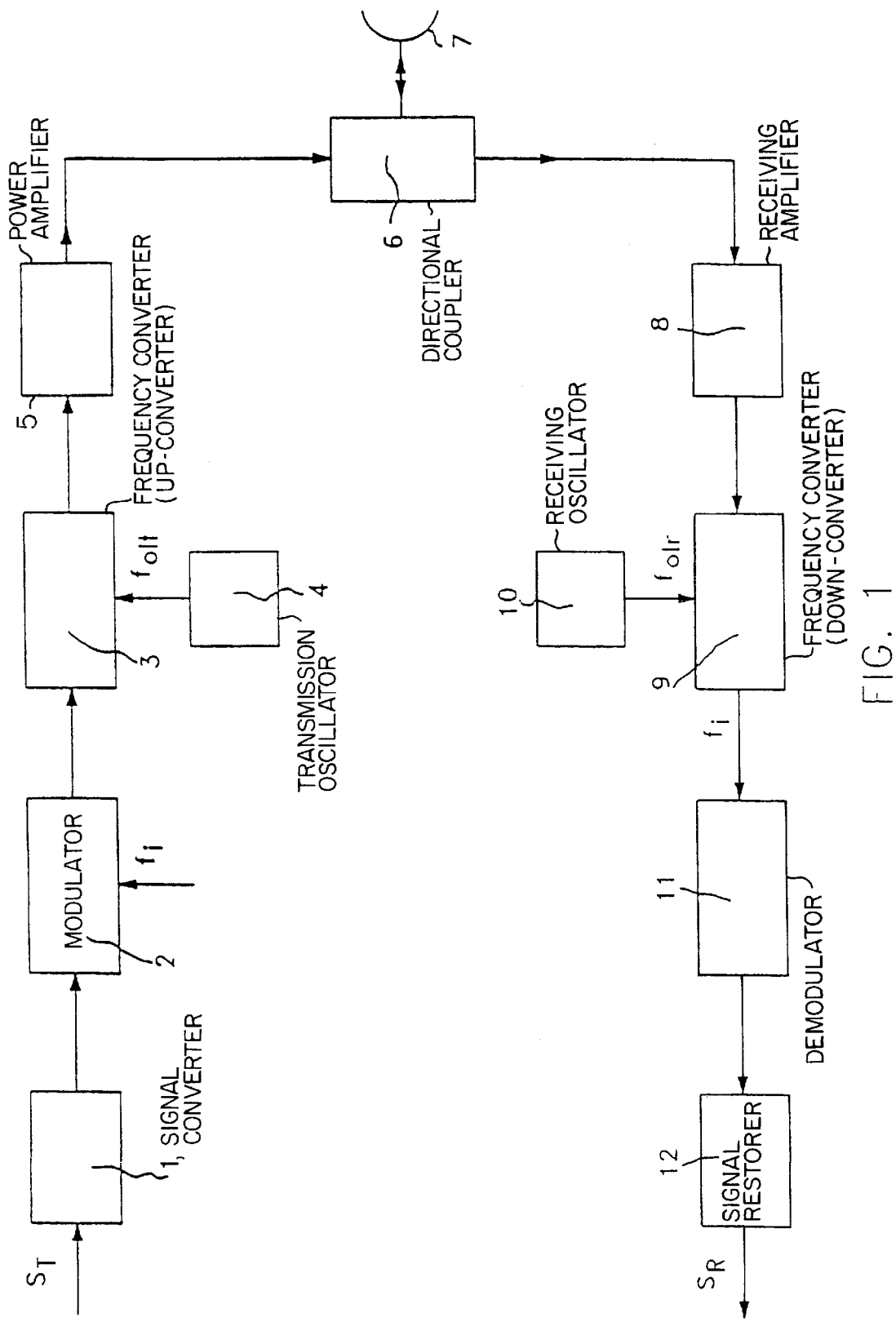
FIG. 1 shows a block diagram of a transmission system in accordance with the prior art.
Figure 2:
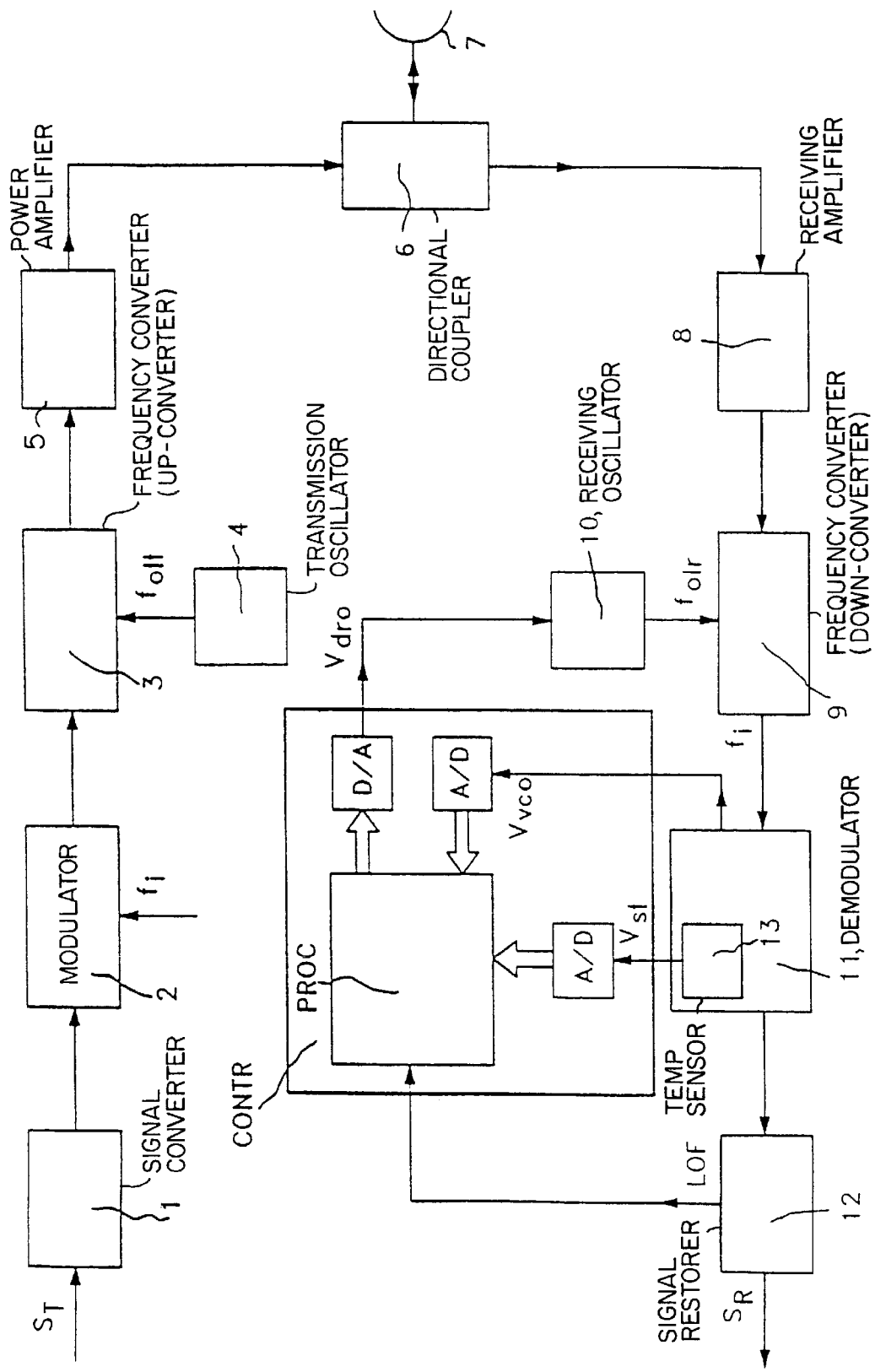
FIG. 2 shows a block diagram of a transmission system in accordance with the present invention, and FIGS. 3.$a$ and 3.$b$ show a flow chart of a program controlling the operation of a microprocessor indicated by PROC in FIG. 2.

With reference to FIG. 2, in which the elements common to FIG. 1 are indicated by the same symbols, it is seen that the transmission system shown there differs from the known one of FIG. 1 mainly by the presence of a control block CONTR and a sub-block 13 placed in the demodulator 11. The block CONTR includes a block PROC, two analog/digital converters A/D and a digital/analog converter D/A. The sub-block 13 represents a temperature sensor and the block PROC a general purpose microprocessor with the additional hardware necessary for operation and additional interfacing. The sensor 13 supplies to a first converter A/D a voltage $V_{st}$ proportionate to the temperature detected in the demodulator 11. The digitized value of $V_{st}$ is read by the microprocessor PROC. At a second converter A/D arrives a voltage $V_{vco}$ generated in the demodulator 11 for control of a VCO inserted in a PLL. The digitized value of voltage $V_{vco}$ is read by the microprocessor PROC. The block 12 associated with the base band operations on the demodulated signal supplies an alarm bit LOF to the microprocessor PROC. The latter processes the data received and supplies to the converter D/A a digital signal, converted thereby into a voltage $V_{dro}$ which reaches a control input of the local receiving oscillator 10.

The example of FIG. 2 refers to a digital microwave radio link whose operation is explained below with particular reference to blocks 1, 2, 11 and 12, which are affected by the digital signal, and to the control block CONTR which is the one more fully involved in the present invention.

The input signal $S_T$ is a digital signal coming from a Synchronous Digital Hierarchy (SDH) multiplex and specifically it is a sub-STM-1 signal with 51.84 Mb/s.

For further information, the characteristics of SDH signals are described in CCITT Recommendation G.707, G.708 and G.709.

The operations performed by the block 1 on the input signal $S_T$ consist mainly of conversion of the line code and addition of any service channels.

The modulator 2 adds to the digital signal supplied it by the block 1 some redundancy bits obtained by appropriately coding the input bit string to correct any errors in the demodulated signal. The redundant signal is filtered digitally and optimally for shaping of the transmission channel and then used to modify an intermediate frequency carrier $f_i$ in accordance with a 16-BCM (Block Code Modulation) diagram, virtually based on a QAM modulation. The value of $f_i$ is the classical value of 70 MHz generated by an independent reference quartz oscillator. The band occupied by the modulated signal is 28 MHz.

The local transmission oscillator 4 is a high-Q DRO tuned to the center-band frequency of the channel to be transmitted ±70 MHz. The transmission signal emerging from the frequency converter 3 can be set within a range of frequencies between 7.1 GHz and 8.5 GHz by an appropriate choice of the DRO 4.

Regarding the reception part, the only one that really concerns the present invention, it is specified that the local receiving oscillator 10 is a DRO of known type possessing a tuning interval of 350 MHz, such as to allow selection of twelve different channels by rotation of a tuning screw. The frequency oscillation $f_{olr}$, in addition to manually, can be changed within a narrow range of frequencies even electronically by acting on the bias voltage of a varicap diode. The width of the tuning interval allowed by the varicap diode is a few MHz, which does not constitute a problem for the purposes of the invention since electronic tuning is used for introducing a correction in the tuning of a channel already selected manually.

As already mentioned, in the absence of appropriate corrections made by the block CONTR, the heat variations in the environment in which is inserted the DRO 10 could cause excessive variation of the local oscillator frequency $f_{olr}$. Due to the effect of the frequency conversion the same variations would be found in the value of the intermediate frequency carrier $f_i$ emerging from the frequency converter 9 and cause serious shortcomings in the demodulation.

As known, reconstruction of the intermediate frequency carrier by the demodulator 11 takes place on the basis of the carrier information contained in the $f_i$ signal emerging from the converter 9, after appropriate intermediate frequency filtering by a filter not shown in FIG. 2. The local carrier is used by the demodulator to bring the received signal back into base band. After this, in the demodulator 11 the synchronisms for reading of the bits are recovered. On the bits read, redundancy is examined and errors are corrected.

The block 12 receives the digital signal processed by the demodulator 11, seeks the frame synchronism and extracts the service channels, and finally converts the bit string into the line code, restoring the original sub-STM-1 signal at 51.84 Mb/s. If for any reason it were not possible to synchronize the frames, the block 12 would supply an alarm bit denominated Loss of Frame (LOF) to signal the loss of frame synchronism.

In light of the above remarks it appears clear that the serious shortcomings caused by excessive variations in the frequency $f_{olr}$ are the possible loss of locking of the PLL included in the demodulator 11, and the distortion of the intermediate frequency signal caused by deviation of the $f_i$ carrier with respect to the center-band value of the intermediate frequency filter.

The processing done by the microprocessor PROC sets out to result in the above mentioned appropriate corrections designed to hold constant the value of the frequency $f_{olr}$ with temperature variation and aging. Operation of the microprocessor PROC is controlled by a program whose flow chart is shown in FIGS. 3.a and 3.b, which are discussed below after introduction of some remarks which justify the use of the temperature sensor 13.

Considering operation of the PLL belonging to the demodulator 11, the phase error is null after locking and at the control input of the VCO the voltage $V_{vco}$ has taken form. Under temperature conditions considered normal (25° C.) this voltage assumes an optimal value $V_{ott}$ such that VCO, virtually excluded from the PLL, would oscillate freely at a frequency of 70 MHz. The above mentioned value $V_{ott}$ is taken as indicative of a frequency reference for the subsequent processing of the stabilization process. This means that a deviation of the actual value of $V_{vco}$ from $V_{ott}$ constitutes an error signal E indicating the amount of the frequency deviation between $f_i$ and the nominal value of 70 MHz due to the effect of temperature or aging or, in a fully equivalent manner, deviation of $f_{olr}$ from its optimal value. This is strictly true only if $V_{ott}$ does not depend in turn on temperature, but that is not so since the dependence exists due to the heat effect on operation of the various components and circuits making up the PLL. In conclusion, it will be $V_{ott}=V_{ott}(T)$.

In practice what needs to be done to neutralize the temperature effect on $V_{ott}$, and thus keep unchanged the previous meaning of the error E, is to appropriately modify the initial value of $V_{ott}$ with temperature change. It is just the function of the temperature sensor 13 to supply the necessary information to the microprocessor PROC for correction of $V_{ott}$, after which the correction of the carrier $f_i$ will also be congruent.

With reference to FIGS. 3.a and 3.b there is now discussed in detail the automatic local oscillator frequency stabilization process which is the object of the present invention, and whose execution is preceded by rotation of the tuning screw of the DRO 10 until it reaches a position corresponding to a channel to which it is desired to tune. The process distinguishes between three different operating conditions designated 'start', 'normal' and 'alarm', to which correspond different execution strategies.

After the start, in the step F1 the microprocessor initializes some registers and appropriate memory zones used later, in particular the initial value of $V_{ott}$ is memorized and the content of a counter COUNT is zeroed. The program then enters the 'start' condition consisting of the steps from F2 to F8 in which:

in step F2 is generated a succession of values of $V_{dro}$ whose behavior in time constitutes a scale of discreet values such as to approximate a voltage ramp; the voltage $V_{dro}$ acts on the varicap diode included in the DRO 10 and causes a variation in the frequency $f_{olr}$ of ±2 MHz around the central operating value;

in the following step F3 is examined the logical condition of the alarm LOF; as long as the alarm is present it means that the PLL of the demodulator 11 has not yet reached the lock and steps F2 and F3 are thus repeated cyclically until the alarm disappears and the PLL is locked. At this point starts a cycle of iterative optimization of the local oscillator frequency $f_{olr}$ as a function of operating temperature. In a first approximation, in the program it is reasonably assumed that for the entire duration of the above mentioned cycle the PLL maintains the lock.

The cycle starts with a step F4 in which the microprocessor reads the voltage $V_{st}$ supplied by the heat sensor 13 and uses it to correct the $V_{ott}$ previously memorized to obtain an optimal correct value such that, under actual temperature conditions the VCO, virtually excluded from the PLL, would oscillate freely at the frequency of 70 MHz;

in step F5 the value of $V_{vco}$ is read and compared with the value $V_{ott}$ corrected in the preceding step, to obtain the error signal E;

in step F6 the absolute value of error E is compared with a positive value $E_{min}$ small enough that the voltages $V_{ott}$ and $V_{vco}$ can be considered near equal, and consequently the value of the carrier $f_i$ can be considered approximately equal to 70 MHz. In practice, $E_{min}$ corresponds to the absolute value of one or the other of the two limits of the continuous interval of values of the voltage $V_{vco}$ to which is made to correspond the least significant bit in the conversion from analog to digital. If in this step the absolute value of the error E exceeds $E_{min}$, the voltage $V_{dro}$ must be corrected;

in step F7 is calculated an increase $\Delta V$ to be made to the voltage $V_{dro}$; in conformity with the strategy used to correct $V_{dro}$, the increase $\Delta V$ will be an appropriate function of the error E. The function chosen has a very simple form i.e.: $\Delta V(E) = \pm sign(E) = \pm 1$, the unit value corresponding to the least significant bit of the word representing digitally the voltage $V_{dro}$; the choice of the sign ± of the function $\Delta V(E)$ depends on the relationship between $V_{dro}$ and $V_{vco}$ and in any case the correction made to $V_{dro}$ must result in a reduction of the absolute value of the error E. The small size of the correction made has the advantage of greater precision, but in case of big and fast changes in $f_{lor}$ it would force multiple iterations of the cycle; however this eventuality is never generated by heat and aging drift phenomena, which are very slow by definition;

in step 8 the $\Delta V$ increase is added algebraically to the voltage $V_{dro}$ and the program returns to step F4 to complete another iteration of the optimization cycle;

if in step F6 of the iteration the module of the error E is less than $E_{min}$ it means that the total correction made to the local oscillator frequency $f_{olr}$ is sufficient and in this case the processing for the 'start' condition terminates and the processing for the 'normality' condition initiates.

Before continuing the explanation of the program it is appropriate to make some remarks on the timing of the various operations thus far executed. Specifically, the linking cycle consisting of the indefinite repetition of steps F2 and F3 has a duration of several seconds. The length of the duration is a result of the impossibility of subjecting the PLL of the demodulator to a frequency sweep 4 MHz wide in a time too short with respect to the typical PLL locking times, because otherwise the locking ability itself could be compromised. As regards the stabilization cycle of the $f_{olr}$, the duration of each iteration is approximately 80 ms, which corresponds to the sampling interval of the voltages $V_{st}$ and $V_{vco}$. The microprocessor treats the above mentioned voltages digitally before using them in the respective steps F4 and F5 by appropriately averaging the $V_{st}$ values and digitally filtering the $V_{vco}$ to eliminate the fast variations resulting from the carrier recovery algorithm. For the sake of brevity these operations are not shown in FIGS. 3.*a* and 3.*b*. Altogether, the two cycles discussed up to this point require several seconds of processing but this does not affect the characteristics of the transceiver of FIG. 2 since this wait is necessary only during the equipment starting phase and after a long persistence (on the order of a few minutes) of the alarm LOF.

The processing which concerns the 'normality' condition includes all the additional steps excepting steps F10 and F12, which belong to the 'alarm' condition, while the steps F9 and F11 belong to both the above mentioned conditions.

Resuming from step F6, the program traverses initially step F9 in the 'no' direction;

then in step F11 there is performed a test of the alarm LOF, whose presence conducts the program in the 'alarm' condition, abandoning the 'normality' condition;

in the absence of LOF, a counter COUNT is zeroed in F13, an operation which is significant only after return to the 'normality' condition from a previous 'alarm' condition;

there are then performed two steps F14 and F15 to determine the error E, identical to steps F4 and F5 respectively;

the program then enters step F16 in which the absolute value of the error E, calculated in F15, is compared with a positive threshold SEM>$E_{min}$ under which no action is undertaken to bring the error E back to a value less than $E_{min}$. The threshold SEM represents the error E generated by a deviation, higher or lower, of 1000 ppm in the value of the intermediate frequency carrier $f_i$ with respect to the nominal value of 70 MHz; essentially the tolerated deviation is ±70 KHz;

if in F16 the absolute value of the error E is less than or equal to the threshold SEM, it means that it is tolerable; in this case the program returns to F9 and repeats indefinitely the previous cycle consisting of steps F9, F11, F13, F14, F15 and F16 in which the voltages $V_{vco}$ and $V_{st}$ are monitored continually and the value of $V_{ott}$ is updated. The test on the presence of the alarm LOF performed in F11 allows monitoring continuously the state of linking or unlinking of the PLL included in the demodulator 11 for the entire duration of the 'normality' condition;

if in F16 the voltage $V_{vco}$ has deviated significantly from the value $V_{ott}$, there is performed a zeroing cycle of the error E which includes steps F17, F18, F19, F20 and F21, which are identical with the initial optimization cycle of the frequency $f_{olr}$ consisting of steps F4, F5, F6, F7 and F8; the above mentioned zeroing cycle allows centering of the intermediate frequency carrier $f_i$ at the value of 70 MHz without generating any error on the data flow; this is possible thanks to the sufficient band width of the PLL which permits absorption of the jumps of the frequency $f_i$ caused by shifting of the frequency $f_{olr}$. As a result of the fact that the jumps of the frequency $f_i$ can be caused even by changes in the radiofrequency transmission carrier, it is inferred that in this case, too, the carrier $f_i$ is centered at the value of 70 MHz, neutralizing the transmitter frequency instability.

Returning to the test completed in F11, if the alarm LOF is present there, the program enters the 'alarm' condition and in F12 it increases by one unit the content of the counter COUNT which previously was null. As mentioned above, the main cause of generation of the alarm LOF is the loss of locking of the PLL of the demodulator 11, even for reasons not necessary dependent upon operation of the DRO 10;

in the following step F9 of the alarm cycle, consisting of steps F11, F12 and F9, there is performed a test on the content of COUNT to check whether a maximum value COUNTMAX designed to establish the maximum duration of the above mentioned cycle, typically a few minutes, has been exceeded;

if in F9 the condition is found, the alarm cycle terminates and the content of COUNT is zeroed in F10, after which the program returns to F2 for repetition of the processing for the 'start' condition. This is made necessary because, despite the expired wait time, the PLL has not yet managed to recover the locking;

if in F9 the condition is not found true it means that the wait time has not ended, in this case the test for the presence of the alarm LOF performed in the following step F11 gives rise to the possibility of a premature exit from the alarm cycle and return to the 'normality' condition with zeroing of COUNT, since in the meantime the PLL has managed to recover the locking.

In view of the above, the alarm cycle is only a check of the persistence of the alarm LOF, eventually performed during performance of the 'normality' step. It was introduced to prevent the microprocessor PROC from shifting the frequency $f_{olr}$ even in those cases where the alarm LOF condition was caused by phenomena independent of heat drift or by aging of the local oscillator 10.

What is claimed is:

1. Automatic local oscillator frequency stabilization process in radio receivers employing a local oscillator with a wide-band tunable dielectric resonator providing an oscillation frequency to an intermediate frequency converter of the receiving signal, the intermediate frequency supplied by said intermediate frequency converter reaching a demodulator including a Voltage Controlled Oscillator (VCO) inserted in a Phase-Locked Loop (PLL) for reconstruction of an intermediate frequency carrier ($f_i$) used for demodulation, with said local oscillator including manual and electronic tuning means acting on which a desired receiving channel is tuned initially, comprising an initial step of memorization of a voltage $V_{ott}$ considered optimal for control of said VCO, with said optimal value being such that if used for control of the VCO virtually excluded from the PLL and under nominal temperature conditions it would make it oscillate freely at the nominal value of said intermediate frequency ($f_i$); and the following steps repeated cyclically:

a) conversion into digital form of the present value of the VCO control voltage ($V_{VCO}$);

b) comparison of said present value ($V_{vco}$) of the VCO control voltage with said optimal value $V_{ott}$ to obtain an error signal indicative of a frequency deviation of said intermediate frequency carrier ($f_i$) from said nominal value thereof; and c) comparison of the absolute value of said error signal with art appropriate positive threshold the exceeding of which generates a criterion valid for inclusion in a cycle of a following step, d) in which said error signal is converted into analog form and used to command an electronic tuning change of said local oscillator with the direction and amount of said change being such as to cancel out said error signal.

2. The automatic local oscillator frequency stabilization process in accordance with claim 1, wherein said electronic tuning change performed in step d) is obtained by adding to a voltage ($V_{dro}$) controlling said electronic tuning means included in said local oscillator an increase $\Delta V$ which is a function of said error signal.

3. The automatic local oscillator frequency stabilization process in accordance with claim 1 or 2, wherein:

said cyclic repetition of steps a), to d), step a) is preceded by a step a') of acquisition of an actual temperature value near said VCO and by a step a") of correction of said optimal voltage value $V_{ott}$ as a function of said acquired temperature value, to obtain a new optimal value which, if used for control of the VCO virtually excluded from the PLL and under the actual temperature conditions, it would make it oscillate freely at a frequency corresponding to said nominal intermediate frequency ($f_i$);

and in the step b) said present value ($V_{vco}$) of the VCO control voltage is compared with said new optimal value to obtain said error signal.

4. The automatic local oscillator frequency stabilization process in accordance with any one of the above claims, wherein said positive threshold used in step c) takes a first value on persisting of a 'start' condition which first causes seeking of the locking of said PLL and then optimization of the value of said intermediate frequency carrier ($f_i$), with said 'start' condition beginning with energizing of said radio receiver or with an expiration of a maximum time during which said PLL is not in a locking condition; said positive threshold taking a second value higher than said first value on persisting of a condition of 'normality' replacing said 'start' condition or replacing an 'alarm' condition generated by loss of locking of said PLL due to cessation thereof.

5. The automatic local oscillator frequency stabilization process in accordance with claim 4, wherein passing in said 'normality' condition of said second value of said positive threshold results in exchange of said second with said first threshold value, which is maintained until in the comparison performed in said step c) said absolute value of the error signal exceeds said first threshold value, said second threshold value being restored upon occurrence of the contrary case.

6. The automatic local oscillator frequency stabilization process in accordance with claim 4 or 5, wherein:

said first value of said positive threshold is equivalent to the absolute value of a minimum error signal such that it can be considered approximately equal to said optimal voltage $V_{ott}$ and the VCO control voltage ($V_{vco}$);

said 'normality' condition replaces said 'start' condition when said absolute value of the error signal is reduced below said minimum error signal;

said second value of said positive threshold is equivalent to said absolute value of an error signal generated by a shift, considered tolerable, of the value of said intermediate frequency carrier ($f_i$) with respect to said nominal value thereof; and in that, during said 'alarm' condition, said cyclic execution of steps a), to d) is suspended and the passing, or not, of said maximum time is appraised, the recovery of the locking of said PLL before expiration of said maximum time resulting in return to said 'normality' condition.

7. The automatic local oscillator frequency stabilization process in accordance with claim 6, wherein said minimum error signal corresponds to one or the other of two limits of a continuous interval of values of said VCO control voltage ($V_{vco}$) to which is made to correspond to a least significant bit in the analog to digital conversion.

8. The automatic local oscillator frequency stabilization process in accordance with claim 2 or 7, wherein said increase $\Delta V$ is expressed by the function: $\Delta V(E) = \pm \text{sign}(E) = \pm 1$, where E is said error signal.

9. The automatic local oscillator frequency stabilization process in accordance with claim 8, when said frequency depends on 7, and wherein the unit value $\pm 1$ of said function $\pm \text{sign}(E)$ corresponds to said least significant bit of the word representing digitally said VCO control voltage ($V_{vco}$).

10. The automatic local oscillator frequency stabilization process in accordance with any one of the above claims and wherein it is performed by said microprocessor (PROC) already present for operation supervision.

11. An automatic stabilization device for a local oscillator frequency in radio receivers comprising a local oscillator with a wide-band tunable dielectric resonator providing the oscillation frequency to an intermediate frequency converter of a receiving signal, the intermediate frequency supplied by said intermediate frequency converter reaching a demodulator including a Voltage Controlled Oscillator (VCO) inserted in a Phase-Locked Loop (PLL) for reconstruction of an intermediate frequency carrier ($f_i$) used for demodulation, and a microprocessor (PROC) for operation supervision; with said local oscillator including manual and electronic tuning means adjusting which a desired receiving channel is initially tuned, comprising:

means of memorizing a voltage value $V_{ott}$ considered optimal for control of said VCO, with said optimal value being such that if used for control of the VCO, virtually excluded from the PLL and under nominal temperature conditions, it would make it oscillate freely at the nominal value of said intermediate frequency ($f_i$);

means of analog-digital conversion of the present value of the VCO control voltage ($V_{vco}$);

processing means (PROC) for generation of change of a numerical magnitude representative of a control voltage ($V_{dro}$) for said electronic tuning means; and said processing means (PROC), a) acquire at preset times the present values of said VCO control voltage ($V_{vco}$) and compare them with said optimal memorized value $V_{ott}$ to obtain an error signal indicative of the deviation in frequency of said intermediate frequency carrier ($f_i$) from said nominal value thereof, and b) compare the absolute value of said error signal with an appropriate positive threshold the exceeding of which results in a change in said control voltage ($V_{dro}$) of said electronic tuning means with the direction and amount of said change being such as to cancel out said error signal.

12. The automatic local oscillator frequency stabilization device in accordance with claim 11, further comprising a means of acquisition of the actual temperature value near said VCO and of transfer (A/D) to said processing means (PROC) to correct said memorized optimal voltage value $V_{ott}$ and obtain a new optimal value $V_{ott}$ which, if used to control the VCO, virtually excluded from the PLL and under actual temperature conditions, would cause it to oscillate freely at a frequency corresponding to said nominal value of the intermediate frequency ($f_i$).

13. The automatic stabilization device for the local oscillator frequency in accordance with claims 11 or 12, wherein said processing means (PROC) determine said change in the control voltage ($V_{dro}$) of said electronic tuning means, adding to an existing voltage value an increase $\Delta V$ which is a function of said error signal.

14. The automatic stabilization device for the local oscillator frequency in accordance with claims 11 to 13, wherein:

said appropriate positive threshold used by said processing means (PROC) corresponds, until it is exceeded, to the absolute value of an error signal generated by a shifting, considered tolerable, of the value of said intermediate frequency carrier ($f_i$) with respect to said nominal value thereof; wherein upon passing of said threshold the threshold is switched into a least significant bit of the word representing digitally said present value of the VCO control voltage ($V_{vco}$); and wherein said switched threshold returns to the previous value upon zeroing of said error signal.

15. The automatic stabilization device for the local oscillator frequency in accordance with claims 11 to 14, wherein said processing means is formed by said microprocessor (PROC) already present for operation supervision.

* * * * *